(12) United States Patent
Uchida et al.

(10) Patent No.: US 8,263,319 B2
(45) Date of Patent: Sep. 11, 2012

(54) DISPLAY MEMBER EXPOSING METHOD AND PLASMA DISPLAY MEMBER MANUFACTURING METHOD

(75) Inventors: Tetsuo Uchida, Otsu (JP); Yoshiyuki Tsuji, Sapporo (JP); Yuichiro Iguchi, Otsu (JP); Minori Kamada, Otsu (JP)

(73) Assignee: Panasonic Corporation, Osaka (JP)

( * ) Notice: Subject to any disclaimer, the term of this patent is extended or adjusted under 35 U.S.C. 154(b) by 883 days.

(21) Appl. No.: 11/661,178

(22) PCT Filed: Aug. 26, 2005

(86) PCT No.: PCT/JP2005/015503
§ 371 (c)(1),
(2), (4) Date: Nov. 6, 2007

(87) PCT Pub. No.: WO2006/025266
PCT Pub. Date: Mar. 9, 2006

(65) Prior Publication Data
US 2009/0142703 A1 Jun. 4, 2009

(30) Foreign Application Priority Data
Aug. 30, 2004 (JP) ................. 2004-250103

(51) Int. Cl.
*G03F 1/00* (2012.01)
*G03F 7/00* (2006.01)
(52) U.S. Cl. ........ 430/322; 430/256; 430/258; 430/302; 430/311
(58) Field of Classification Search .............. 430/302, 430/322, 256, 258, 311
See application file for complete search history.

(56) References Cited

U.S. PATENT DOCUMENTS
2005/0259203 A1* 11/2005 Kimura et al. ............... 349/124

FOREIGN PATENT DOCUMENTS

| JP | 48-052479 A | 7/1973 |
|---|---|---|
| JP | 56-162747 A | 12/1981 |
| JP | 57-186329 A | 11/1982 |
| JP | 2-165538 A | 6/1990 |
| JP | 06-314542 | 8/1994 |
| JP | 7-320641 A | 12/1995 |
| JP | 11-233428 A | 8/1999 |
| JP | 2000-113814 | 4/2000 |
| JP | 2000-306818 A | 11/2000 |
| JP | 2003-162065 A | 6/2003 |
| JP | 2004-240095 A | 8/2004 |

OTHER PUBLICATIONS

International Search Report dated Nov. 29, 2005, application No. PCT/JP2005/015503.

* cited by examiner

*Primary Examiner* — Thorl Chea
(74) *Attorney, Agent, or Firm* — Hamre, Schumann, Mueller & Larson, P.C

(57) ABSTRACT

A manufacturing method for a plasma display member wherein generation of defects such as interruption and short-circuit of a pattern obtained after exposure and development is suppressed and yield is improved, even when a foreign material is adhered on a photo mask or photo mask is scratched. An exposing method for a display member wherein a display member having a photosensitive layer formed on a base substrate is exposed through a photo mask having a desired pattern. The exposing method for the display member is characterized in that the photo mask and the base substrate are relatively shifted during exposure operation.

6 Claims, 6 Drawing Sheets

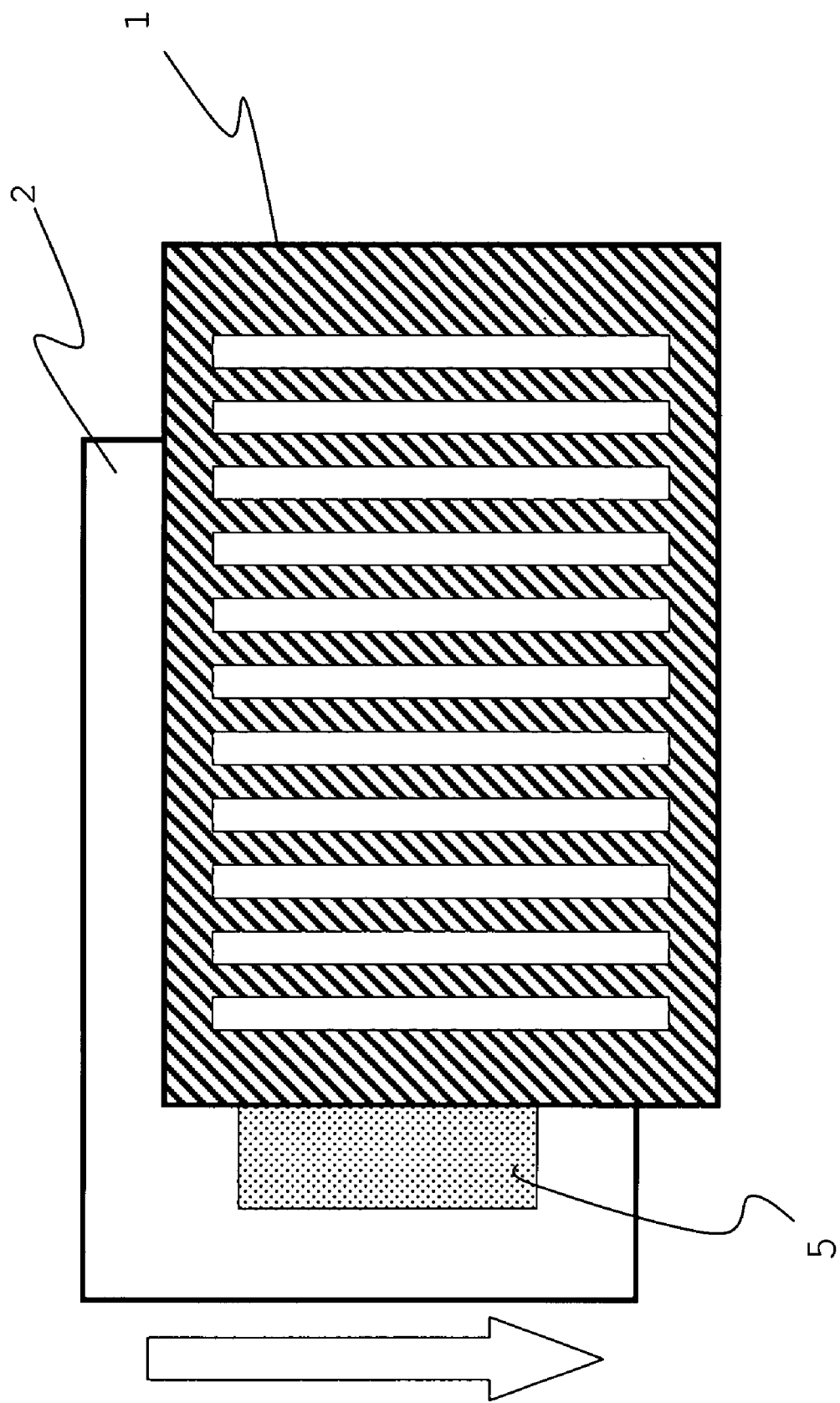
[Fig. 1]

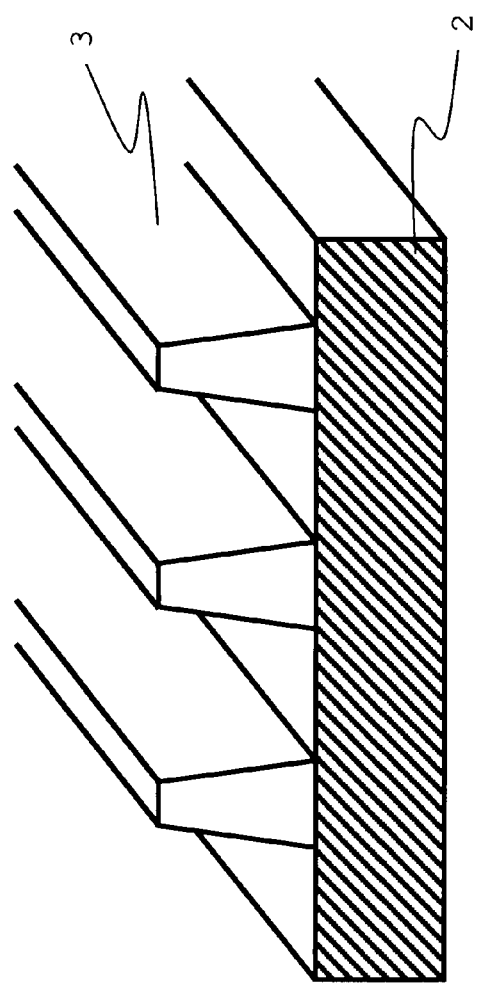
[Fig. 2]
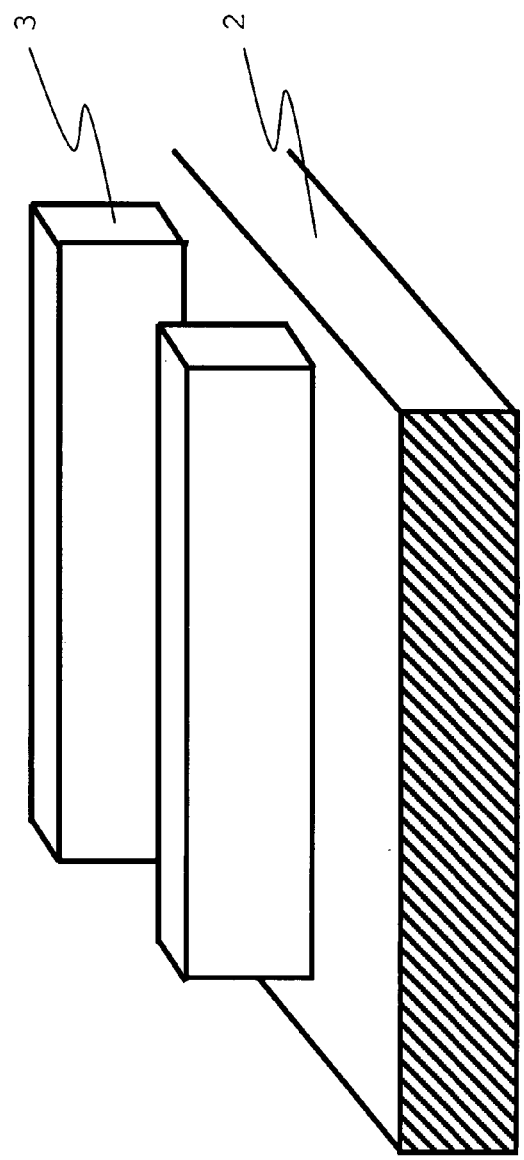
[Fig. 3]

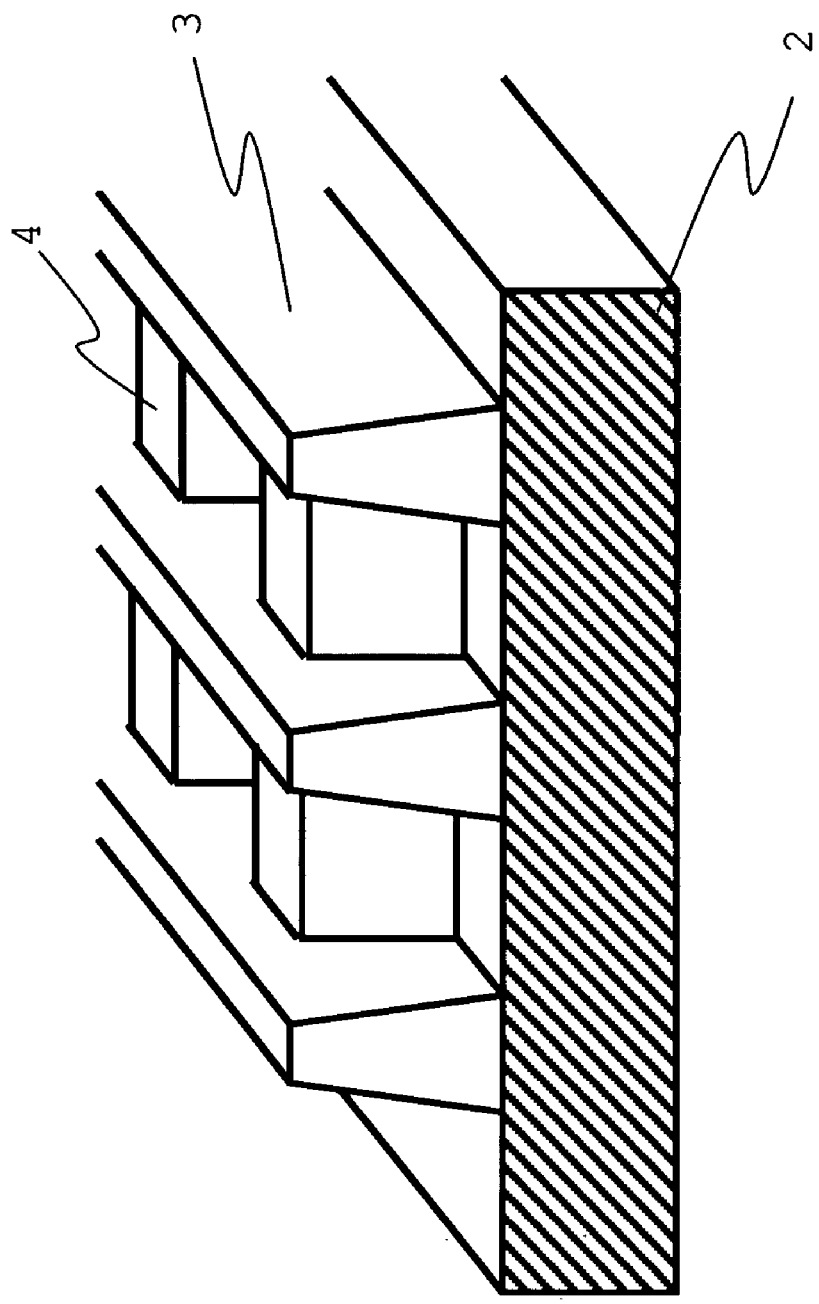
[Fig. 4]

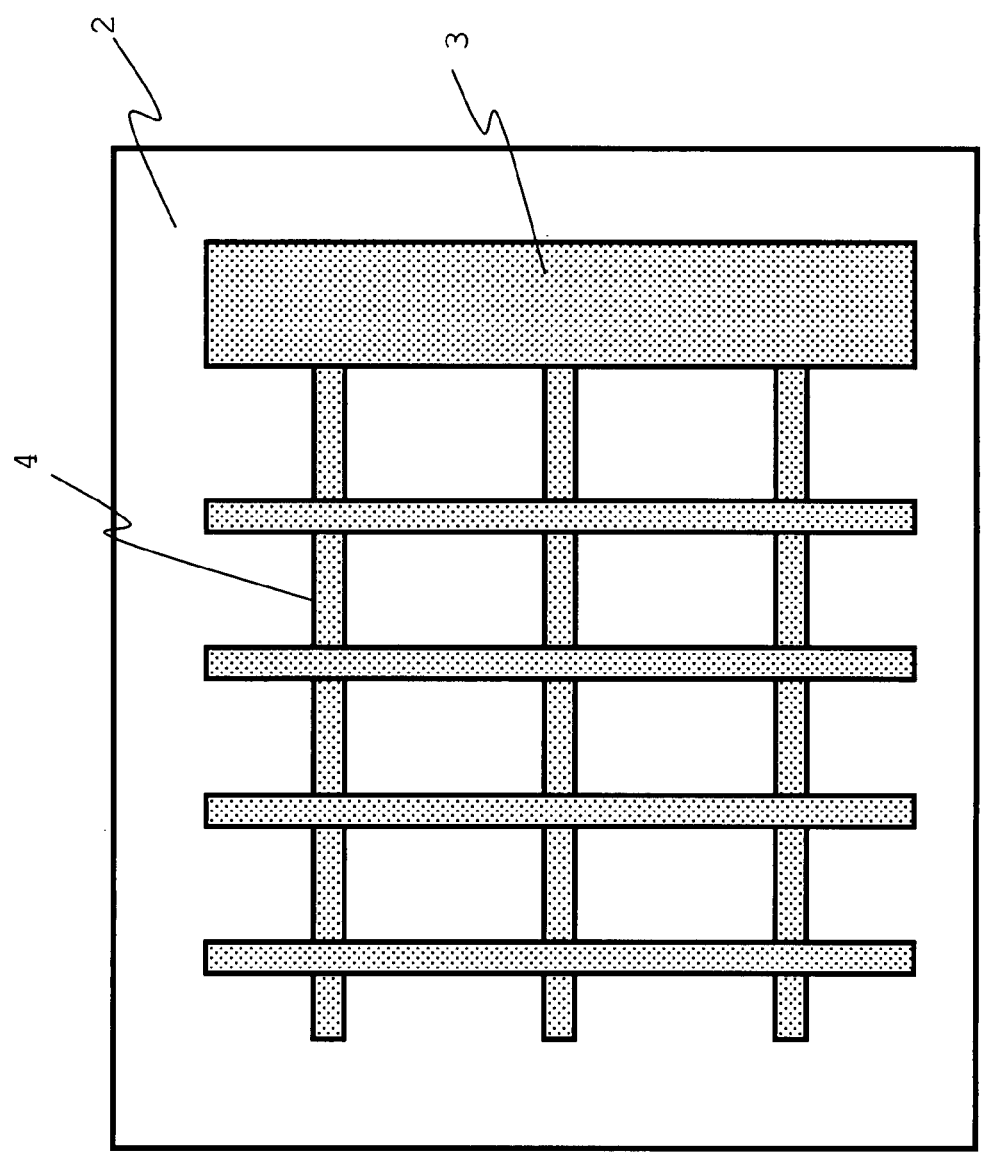
[Fig. 5]

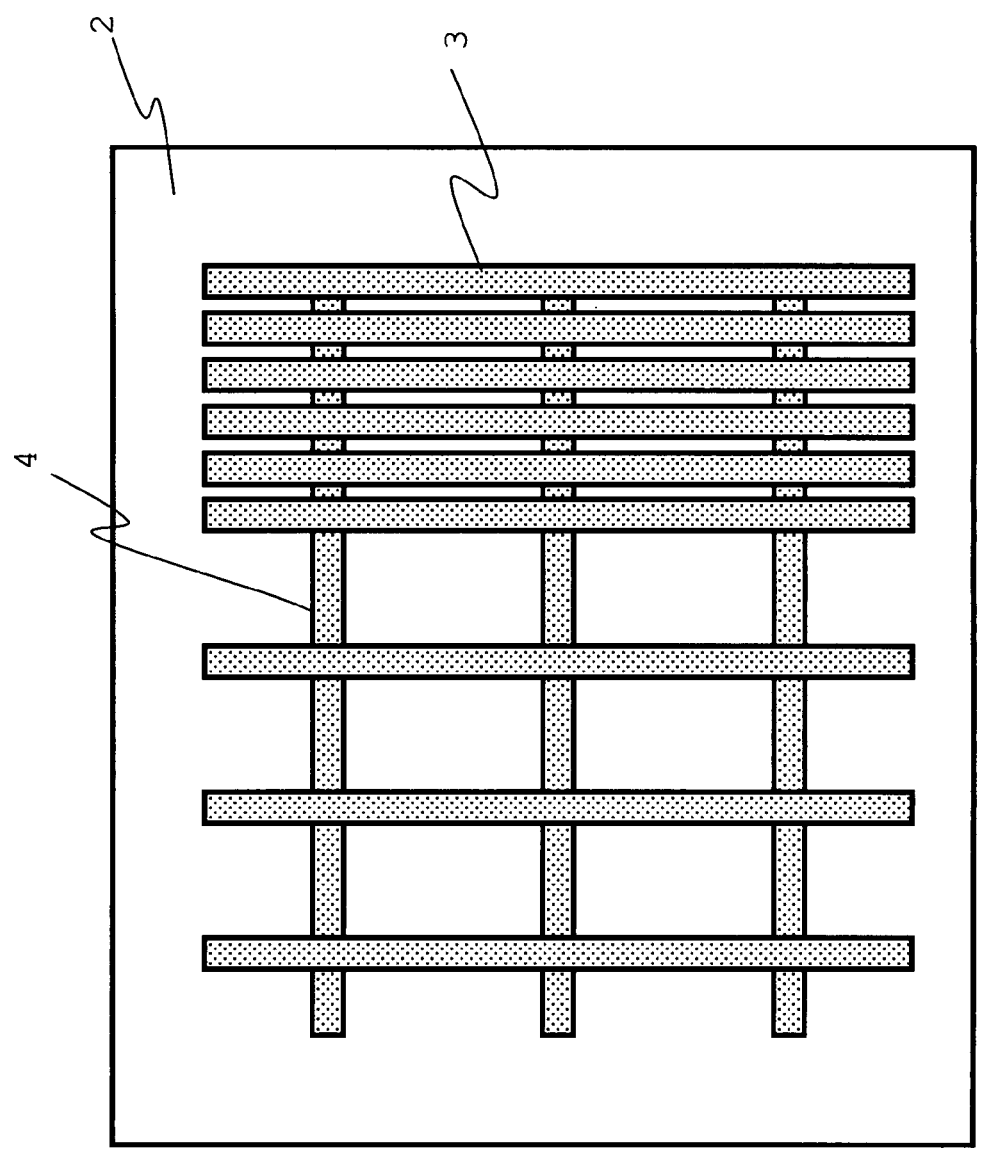
[Fig. 6]

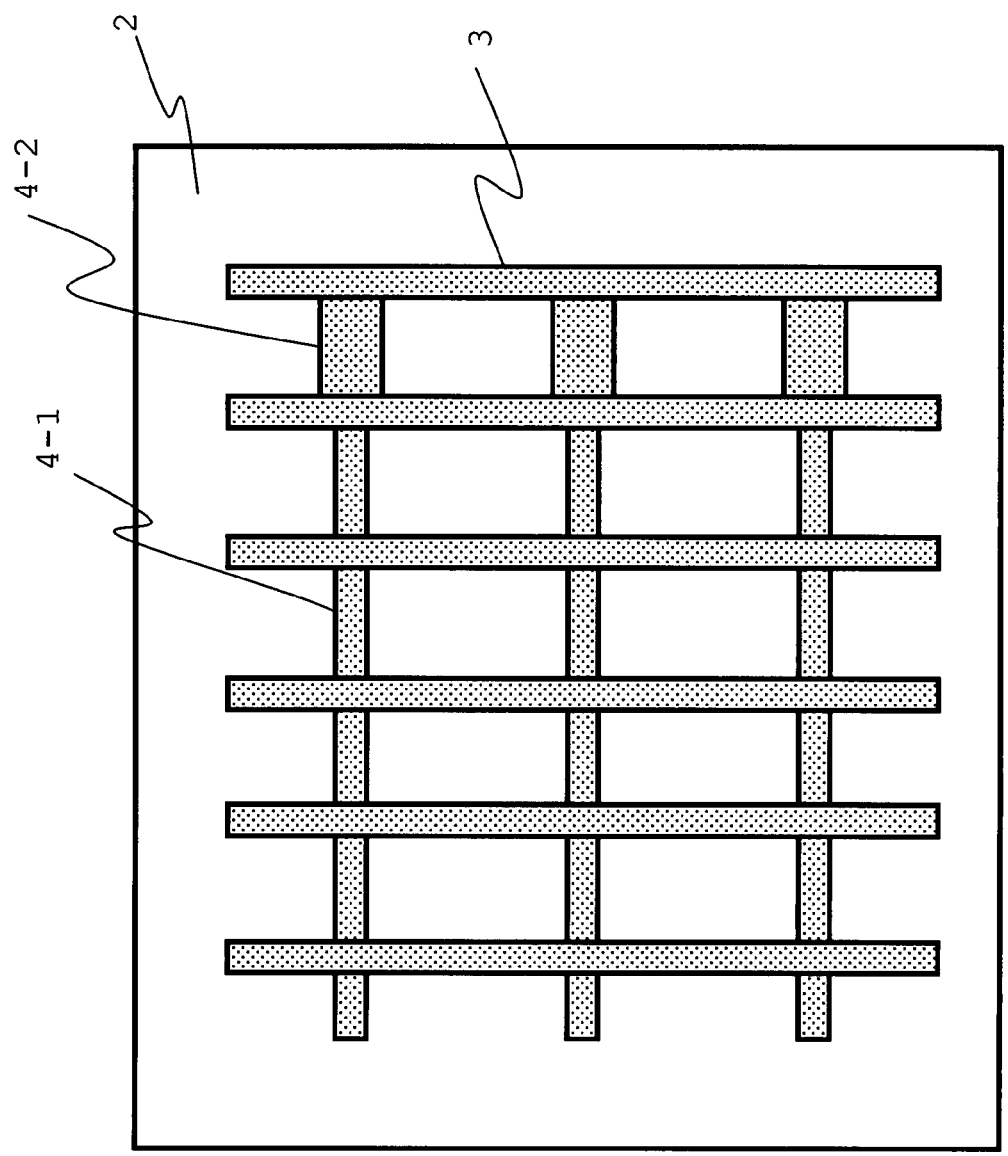
[Fig. 7]

DISPLAY MEMBER EXPOSING METHOD AND PLASMA DISPLAY MEMBER MANUFACTURING METHOD

This is a U.S. National Phase application of application number PCT/JP2005/015503, filed Aug. 26, 2005.

TECHNICAL FIELD

The present invention relates to an exposing method for a display member and a manufacturing method a plasma display member using the exposing method.

BACKGROUND ART

As displays that can be used for large and thin TV sets, plasma display panels (hereinafter abbreviated as PDPs) attract attention. Among the electrode layer, dielectric layer, MgO layer, barrier rib layer and phosphor layer as the components of a PDP, it is known that the electrode layer, dielectric layer, barrier rib layer and phosphor layer can be formed respectively by a method of coating or laminating a base substrate with a photosensitive paste, exposing it through a photo mask having a desired pattern, and developing using a desired developer.

For example, proposed methods are a method comprising the steps of forming a layer consisting of a ceramic powder and a UV-curable resin on a base substrate, exposing it through a photo mask having a desired pattern, and developing to form a barrier rib layer (Patent Document 1), a method comprising the steps of coating a base substrate with a glass paste, drying, coating with a resist, exposing the resist through a photo mask having a desired pattern, developing, and sandblasting to form a barrier rib pattern (Patent Document 2), and a method comprising the steps of coating a barrier rib layer with a photosensitive phosphor paste and exposing it through a photo mask (Patent Document 3).

However, the above methods have a problem that in the case where the photo mask contains foreign matters deposited on it or has flaws, the pattern obtained after exposure and development mostly has defects such as disconnections and short-circuits, to lower the yield.

As a method for solving the problem; it is proposed to prepare a photo mask with the length of its opening kept shorter than the length of the pattern layer and to expose while moving the base substrate or photo mask (Patent Document 4). However, this method has a problem that in the case of a thick pattern of, for example, barrier ribs of a PDP, exposure shortage occurs at the ends in the moving direction of the base substrate or photo mask, to thin or peel the pattern.

[Patent Document 1] JP2-165538A
[Patent Document 2] JP7-320641A
[Patent Document 3] JP2000-113614A
[Patent Document 4] JP2004-240095A

DISCLOSURE OF THE INVENTION

Problem to be Solved by the Invention

In view of the above background art, the problem addressed by the present invention is to provide a method for manufacturing a display member unlikely to have such defects as disconnections and short-circuits at a high yield.

Means for Solving the Problem

To solve the aforesaid problem, this invention has the following constitution. This invention provides an exposing method for a display member in which an exposure operation for exposing a display member with a photosensitive layer 5 formed on a base substrate 2 through a photo mask 1 having a desired pattern is performed, characterized in that the photo mask 1 and the base substrate 2 are moved relatively to each other during the exposure operation. Further, this invention provides a display member manufacturing method using said exposing method.

Effect of the Invention

This invention can provide a method for exposing a display member at a high yield, since the occurrences of defects such as pattern disconnections and short-circuits can be reduced even in the case where the photo mask 1 has foreign matters deposited on it or has flaws.

BRIEF DESCRIPTION OF THE DRAWINGS

FIG. 1 is an illustration of the exposing method for the display member of this invention.

FIG. 2 is a perspective view showing an example of the shape of the barrier ribs manufactured by this invention.

FIG. 3 is a perspective view showing another example of the shape of the barrier ribs manufactured by this invention.

FIG. 4 is a perspective view showing a further other example of the shape of the barrier ribs manufactured by this invention.

FIG. 5 is a typical view showing an example of the pattern form of the barrier ribs manufactured by this invention.

FIG. 6 is a typical view showing another example of the pattern form of the barrier ribs manufactured by this invention.

FIG. 7 is a typical view showing a further other example of the pattern form of the barrier ribs manufactured by this invention.

MEANINGS OF SYMBOLS

1: photo mask
2: base substrate
3: barrier rib
4: auxiliary barrier rib
4-1: standard pattern portion
4-2: pattern end
5: photosensitive layer

THE BEST MODES FOR CARRYING OUT THE INVENTION

This invention comprises an exposure step of performing an exposure operation for exposing an at least photosensitive layer 5 formed on a base substrate 2 through a photo mask 1 having a desired pattern. The exposure operation in this case refers to an operation of continuously irradiating an energy beam through a photo mask 1 having a desired pattern. Therefore, one exposure operation refers to an operation from the start to end of energy beam irradiation. Further, the photo mask 1 refers to a photo mask 1 having a desired pattern consisting of portions allowing the energy beam to pass through them and portions intercepting the energy beam. In the case where the photosensitive layer 5 to be exposed is negative, the photosensitive layer 5 is hardened in the portions exposed to the energy beam through the photo mask 1, and in the case where the photosensitive layer 5 is positive, it is decomposed in the corresponding portions. Subsequently a desired developer is used to dissolve and remove the unnecessary portions for forming an intended pattern.

However, if the photo mask 1 used has foreign matters deposited on it or has flaws or has bubbles contained in it, the energy beam is intercepted or refracted at the portions, and the obtained pattern has disconnections, chippings, short-circuits, thickenings or the like. These defects occur almost at the same portions till the photo mask 1 is washed or exchanged to pose a problem of lower yield.

On the contrary as in this invention, if either (1) a method in which exposure is performed while the photo mask 1 or the base substrate 2 is moved (the exposure method as shown in FIG. 1, in which the photo mask 1 and the base substrate 2 are moved relatively to each other during an exposure operation) or (2) a method in which after completion of one exposure operation, the photo mask 1 or the base substrate 2 is moved once, being followed by a second exposure operation (an exposure method in which the photo mask 1 and the base substrate 2 are moved relatively to each other in the duration between at least two exposure operations) is employed, the occurrences of defects in the obtained pattern can be prevented, since the places intercepting the energy beam due to foreign matters, flaws, bubbles, etc. are not fixed. This invention is described below in reference to the methods for forming the respective layers of a plasma display member (hereinafter abbreviated as a PDP member). In general, a PDP member consists of a front panel consisting of a layer of plural sustain electrodes as pairs, black stripe layer, dielectric layer, MgO layer, etc. and a rear panel consisting of an address electrode layer, dielectric layer, barrier rib layer, phosphor layer, etc.

At first, the sustain electrodes of the front panel and the address electrodes of the rear panel are respectively formed by disposing a metal such as silver, aluminum, chromium or nickel as a desired pattern on a base substrate 2. Examples of the base substrate 2 used in this invention include soda glass, "PD200" produced by Asahi Glass Co., Ltd. and "PP8" produced by Nippon Electric Glass Co., Ltd. respectively as heat resisting glass for PDP, etc.

As a method for forming electrodes, photolithography can be used, which comprises the steps of applying a photosensitive metal paste consisting of a powder of any of the aforesaid metals and a photosensitive organic ingredient, exposing it through a photo mask 1 having a pattern, dissolving and removing unnecessary portions by development, and further heating and firing at 400 to 600° C., to form an electrode pattern.

In the case where this invention is applied for forming an electrode layer as described above, the aforesaid method (2) is often applied. That is, a coating film of photosensitive metal paste formed on a base substrate 2 and a photo mask 1 having a desired pattern are aligned to each other, followed by one time of exposure (exposure operation 1), and the base substrate 2 or the photo mask 1 is moved by a desired distance, followed by re-alignment and exposure (exposure operation 2). If this method is applied, the defects caused by the foreign matters deposited on the photo mask 1 or by the flaws, bubbles or the like formed in the photo mask 1 can be prevented from occurring.

An electrode layer of a PDP member generally consists of three sections; terminal section, connection lead section and display section. In the case where this invention is applied to the formation of such an electrode layer, it is preferred that the respective blocks of the terminal section are of the same pattern. That is, if the movement between the exposure operation 1 and the exposure operation 2 is performed at the same pitch as that of the terminal blocks, an agreement in pattern can be achieved.

It is preferred that the thickness of the electrodes formed in this invention is 1 to 10 μm. A more preferred range is 2 to 7 μm. If the thickness of the electrodes is too small, there arises a tendency that the accurate drive becomes difficult, since the resistance value becomes large. If the thickness is too large, there arises a tendency toward disadvantageous cost, since the necessary material increases. It is preferred that the line width of the electrode layer is 20 to 2300 μm. A more preferred range is 30 to 200 μm. If the line width of the electrode layer is too small, there arises a tendency that the accurate drive becomes difficult, since the resistance value becomes large. If the line width is too large, there arises a tendency that short-circuit defects are likely to occur, since the distance between adjacent electrodes becomes short. Further, the electrodes are formed at a pitch corresponding to that of display cells (each cell refers to an area for forming each RGB pixel). It is preferred that the pitch of ordinary PDP is 100 to 500 μm, and that the pitch of high precision PDP is 100 to 400 μm.

Then, the dielectric layer of the front panel or rear panel can be formed by coating said electrode layer with a glass paste mainly composed of a glass powder and an organic binder and firing at 400 to 600° C. As the glass paste used for the dielectric layer, a glass powder containing at least one or more of lead oxide, bismuth oxide, zinc oxide and phosphorus oxide by 10 to 80 wt % in total can be preferably used. If the amount is 10 wt % or more, firing at 600° C. or lower is easy, and if the amount is 80 wt % or less, crystallization and the decline of transmission can be prevented.

The glass powder and an organic binder can be kneaded to prepare a paste. As the organic binder, a cellulose compound such as ethyl cellulose or methyl cellulose or an acrylic compound such as methyl methacrylate, ethyl methacrylate, isobutyl methacrylate, methyl acrylate, ethyl acrylate or isobutyl acrylate, etc. can be used. Further, the glass paste can also contain an additive such as a solvent or plasticizer.

As the solvent, a general purpose solvent such as terpineol, butyrolactone, toluene or methyl cellosolve can be used. Further, as the plasticizer, dibutyl phthalate, diethyl phthalate or the like can be used. If filler is added as an ingredient in addition to the glass powder, a PDP with a high reflectance and high brightness can be obtained. Preferred examples of the filler include titanium oxide, aluminum oxide, zirconium oxide, etc. It is especially preferred to use titanium oxide with a particle size of 0.05 to 3 μm. It is preferred that the filler content is such that the ratio by weight of glass powder: filler is 1:1 to 10:1. If the filler content is not smaller than one tenth of the glass powder, the effect of improving brightness can be obtained. If the filler content is not larger than the glass powder content, sintering capability can be kept. Further, if conductive fine particles are added, a PDP highly reliable at the time of driving can be produced. It is preferred that the conductive fine particles are a metal powder of nickel or chromium, etc., and that the particle size is 1 to 10 μm. If the particle size is 1 μm or more, the intended effect can be sufficiently exhibited, and if it is 10 μm or less, the surface ruggedness of the dielectric can be kept small to facilitate the formation of the barrier ribs. It is preferred that the content of the conductive fine particles in the dielectric layer is 0.1 to 10 wt %. If the content is 0.1 wt % or more, the intended effect can be obtained, and if it is 10 wt % or less, short-circuits between adjacent address electrodes can be prevented. It is preferred that the thickness of the dielectric layer is 3 to 30 μm, and a more preferred range is 3 to 15 μm. If the thickness of the dielectric layer is too small, there arises a tendency that many pinholes are formed, and if it is too large, there arises a tendency that the discharge voltage becomes high to increase power consumption.

Further, as the dielectric layer, a structure having a desired pattern of projections and depressions can be preferably applied. In this case, as the organic binder, a photosensitive dielectric paste containing a photosensitive organic ingredient may be used.

It is preferred that the photosensitive organic ingredient is at least one photosensitive ingredient selected from photosensitive monomers, photosensitive oligomers and photosensitive polymers. Further, as required, a photopolymerization initiator, light absorber, sensitizer, organic solvent, sensitization aid and polymerization inhibitor are added.

The photosensitive monomer is a compound containing an unsaturated carbon-carbon bond, and particular examples of it include monofunctional and polyfunctional (meth)acrylates, vinyl compounds, allyl compounds, etc. One or more of them can be used.

The photosensitive oligomer or photosensitive polymer is an oligomer or polymer obtained by polymerizing at least one of the compounds having a carbon-carbon double bond. In the polymerization, the compound with a carbon-carbon double bond can be copolymerized with another photosensitive monomer, if the content of the compound with a carbon-carbon double bond is 10 wt % or more, preferably 35 wt % or more. If an unsaturated acid such as an unsaturated carboxylic acid is copolymerized with the polymer or oligomer, the development property after sensitizing can be improved. Particular examples of the unsaturated carboxylic acid include acrylic acid, methacrylic acid, itaconic acid, crotonic acid, maleic acid, fumaric acid, vinylacetic acid, their acid anhydrides, etc. It is preferred that the acid value (AV) of the polymer or oligomer with acid groups such as carboxyl groups at the side chains obtained like this is in a range from 50 to 180. A more preferred range is 70 to 140. If photoreactive groups are added to the side chains or molecular ends of any of the polymers and oligomers mentioned above, the product can be used as a photosensitive polymer or photosensitive oligomer. Preferred photoreactive groups are ethylenic unsaturated groups. As the ethylenic unsaturated groups, enumerated are vinyl groups, allyl groups, acrylic groups, methacrylic groups, etc.

Particular examples of the photopolymerization initiator include benzophenone, methyl O-benzoylbenzoate, 4,4-bis (dimethylamino)benzophenone, 4,4-bis(diethylamino)benzophenone, 4,4-dichlorobenzophenone, 4-benzoyl-4-methylphenylketone, dibenzyl ketone, fluorenone, 2,3-diethyoxyacetophenone, 2,2-dimethoxy-2-phenyl-2-phenylacetophenone, etc. One or more of them can be used. It is preferred that the added amount of the photopolymerization initiator is in a range from 0.05 to 10 wt % based on the weight of the photosensitive ingredient. A more preferred range is 0.1 to 5 wt %. If the amount of the polymeric initiator is too small, there arises a tendency toward lower photosensitivity, and if it is too large, there arises a tendency that the remaining rate of the exposed area becomes too small.

It is also effective to add a light absorber. If a compound with a high effect of absorbing ultraviolet light or visible light is added, a high aspect ratio, high precision and high resolution can be obtained. As the light absorber, an organic dye can be preferably used. Particularly azo dyes, aminoketone dyes, xanthene dyes, quinoline dyes, anthraquinone dyes, benzophenone dyes, diphenylcyanoacrylate dyes, triazine dyes, p-aminobenzoic acid dyes, etc. can be used. An organic dye is preferred for the reason that since it does not remain in the insulation film after firing, the decline of insulation film property by the light absorber can be reduced. Among these dyes, azo dyes and benzophenone dyes are preferred. It is preferred that the added amount of the organic dye is 0.05 to 5 wt %. A more preferred range is 0.05 to 1 wt %. If the added amount is too small, the effect of adding the light absorber tends to decrease, and if it is too large, the insulation film property after firing tends to decline.

The sensitizer is added for enhancing the sensitivity. Particular examples of the sensitizer include 2,4-diethylthioxanthone, isopropylthioxanthone, 2,3-bis(4-diethylaminobenzal)cyclopentanone, 2,6-bis(4-dimethylaminobenzal) cyclohexanone, etc. One or more of them can be used. In the case where the sensitizer is added to the photosensitive paste, the added amount of it is usually 0.05 to 10 wt % based on the weight of the photosensitive ingredient. A more preferred range is 0.1 to 10 wt %. If the amount of the sensitizer is too small, there arises a tendency that the effect of improving photosensitivity cannot be exhibited, and if it is too large, there arises a tendency that the remaining rate of the exposed area becomes small.

Examples of the organic solvent include methyl cellosolve, ethyl cellosolve, butyl cellosolve, propylene glycol monomethyl ether acetate, methyl ethyl ketone, dioxane, acetone, cyclohexanone, cyclopentanone, isobutyl alcohol, isopropyl alcohol, tetrahydrofuran, dimethyl sulfoxide, γ-butyllactone, N-methylpyrrolidone, N,N-dimethylformamide, N,N-dimethylacetamide, bromobenzene, chlorobenzene, dibromobenzene, dichlorobenzene, bromobenzoic acid, chlorobenzoic acid, and an organic solvent mixture containing one or more of the foregoing.

Mixing the inorganic fine particles and the organic ingredient usually produces the photosensitive paste. Then, the mixture is dispersed homogeneously by a three-roll mill or kneading machine. The organic ingredient is selected from those enumerated above to achieve a predetermined composition.

Said photosensitive dielectric paste is applied onto a base substrate 2, exposed through a photo mask 1 having a desired pattern, and developed, to form a dielectric layer having a desired pattern of projections and depressions on the surface.

In the case where this invention is applied to forming the dielectric layer with such a pattern, if the pattern to be obtained consists of stripes, a method comprising the steps of aligning the coating film of the photosensitive dielectric paste formed on a base substrate 2 and a photo mask 1 having a desired pattern to each other and moving the base substrate 2 or photo mask 1 in the extension direction of the stripes during exposure can be applied. Otherwise, a method comprising the steps of once exposing the said coating film (exposure operation 1), moving the base substrate 2 or photo mask 1 by a desired distance, aligning again and exposing (exposure operation 2) can be applied. As a result, the occurrences of the defects caused by foreign matters deposited on the photo mask 1 or the flaws, bubbles or the like formed in the photo mask 1 can be reduced. In the case of a pattern other than a striped pattern, the aforesaid latter method can be applied.

Moreover, for the rear panel, a barrier rib layer is preferably formed on said dielectric layer. Even in the case where defects occur in the pattern of said electrode layer, they can be relatively easily repaired, but in the case of a barrier rib layer, repair is difficult since it is higher than the electrode layer. So, this invention can be most preferably applied as a method for forming the barrier rib layer.

It is preferred that the sectional form of the barrier ribs 3 is trapezoidal or rectangular. It is adequate that the height of the barrier ribs 3 in the barrier rib layer is 80 μm to 200 μm. If the height is 80 μm or more, it can be prevented that the phosphors and the scan electrodes become too close to each other and that the deterioration of the phosphors by discharge can be prevented. Further, if the height is 200 μm or less, the distance between the discharge at the scan electrodes and the phosphors can be short enough to obtain sufficient brightness. Furthermore, an often used pitch (P) is 100 μm≦P≦500 μm. For a high precision plasma display, the pitch (P) of barrier ribs 3 is 100 μm≦P≦250 μm. If the pitch is 100 μm or more, the discharge space can be widened and sufficient brightness can be obtained. If it is 500 μm or less, fine pixels can be displayed a beautiful image. If it is 250 μm or less, it can be displayed a beautiful image of HDTV (high vision) level. It is also preferred that among RGB, the pitch of the barrier ribs 3 corresponding to blue relatively low in brightness is larger than those of the other colors. It is preferred that the line width (L) as half width is 10 μm≦L≦50 μm. If it is 10 μm or more, the barrier ribs 3 can have sufficient strength, and when the front panel and the rear panel are sealed to each other, it can be prevented that the barrier ribs 3 are broken. If the line width is 50 μm or less, the area for forming the phosphors can be made large and high brightness can be obtained.

Also a barrier rib pattern of periodic lattices in which auxiliary barrier ribs 4 are formed also in the direction perpendicular to said barrier ribs 3 can be formed preferably by this invention.

If auxiliary barrier ribs 4 are formed, the phosphor layer can be formed also on the wall surfaces of the auxiliary barrier ribs 4, and the light emitting area can be enlarged. In addition, the auxiliary barrier ribs 4 can reduce the erroneous light emission from other than the cells expected to emit light of the PDP. Therefore, since ultraviolet light acts efficiently on the phosphor surface, brightness can be enhanced. Moreover, since the auxiliary barrier ribs 4 exist, the binding area of the barrier ribs 3 as a whole becomes wide, and the member can have a structural strength. As a result, the widths of the barrier ribs 3 and the auxiliary barrier ribs 4 can be narrowed, and the discharge volumes of the display cells can be made large, to further enhance the discharge efficiency. The sectional form of the auxiliary barrier ribs 4 can be trapezoidal or rectangular.

It is preferred that the height of the auxiliary barrier ribs 4 is 1/10 to 1/1 of the height of the barrier ribs. If the height of the auxiliary barrier ribs 4 is 1/10 or more of the height of the barrier ribs 3, the light emission area can be made large to obtain the effect of enhancing brightness. Further, considering the mixing of colors when the phosphor layer is formed and the occurrences of crosstalk with other colors during display on the plasma display, it is preferred that the height of the auxiliary barrier ribs 4 is 1/1 or less of the height of the barrier ribs 3.

It is preferred in view of gas discharge and the efficiency of light emission of the phosphor layer that the positions and pitch at which the auxiliary barrier ribs 4 are formed are such as to partition the pixels when the rear plate is joined with the front panel, to form a plasma display.

It is preferred that the line width of the auxiliary barrier ribs 4 as the crest width is 30 μm to 700 μm. A more preferred range is 40 to 600 μm. If the crest width of the auxiliary barrier ribs 4 is 30 μm or more, the auxiliary barrier ribs 4 can have a strength that can withstand the step of forming the auxiliary barrier ribs 4 and the subsequent steps. If it is 300 μm or less, the auxiliary barrier ribs 4 obtained after firing are homogeneous and strong.

Further, it is preferred that the bottom width of the auxiliary barrier ribs 4 is 1.1 to 1.5 times the crest width of the auxiliary barrier ribs, since the up-springing of the auxiliary barrier ribs 4 by firing shrinkage can be prevented.

As the method for forming the barrier rib layer, photolithography using a photosensitive paste consisting of an insulating inorganic ingredient and a photosensitive organic ingredient can be preferably applied in this invention.

As the inorganic fine particles of the photosensitive paste, a glass or ceramic substance (alumina, cordierite, etc.), etc. can be used. Especially preferred is a glass or ceramic substance containing silicon oxide, boron oxide or aluminum oxide as an essential ingredient.

The particle size of the inorganic fine particles is selected, considering the form of the pattern to be prepared, but it is preferred that the volume-average particle size (D50) is 1 to 10 μm. A preferred range is 1 to 5 μm. If D50 is 10 μm or less, the surface of the pattern obtained is smooth. If it is 1 μm or more, the viscosity of the paste can be easily adjusted. Further, it is especially preferred for pattern formation to use fine glass particles with a specific surface area of 0.2 to 3 m$^2$/g.

Since the barrier ribs 3 and the auxiliary barrier ribs 4 are formed as a pattern on a glass substrate with a low softening point, it is preferred to use inorganic fine particles containing 60 wt % or more of fine glass particles with a softening temperature of 350° C. to 600° C. Further, if fine glass particles or fine ceramic particles with a softening temperature of 600° C. or higher are added, the shrinkage rate during firing can be reduced, but it is preferred that the amount of the glass particles or the fine particles is wt % or less.

As the glass powder, it is preferred to use fine glass particles with a linear expansion coefficient of $50 \times 10^{-7}$ to $90 \times 10^{-7}$, for preventing the glass substrate from warping during firing. A more preferred range is $60 \times 10^{-7}$ to $90 \times 10^{-7}$. As the material of the barrier ribs, it is preferred to use a glass material containing silicon oxide and/or boron oxide.

It is preferred that the mixed amount of silicon oxide is in a range from 3 to 60 wt %. If it is 3 wt % or more, the compactness, strength and stability of the glass layer can be improved, and the thermal expansion coefficient can be kept in a desired range for preventing the mismatching with the glass substrate. The mismatching in this case refers to a case where the difference between the thermal expansion coefficient of the glass substrate and the thermal expansion coefficient of the glass layer for forming the barrier ribs 3 and the auxiliary barrier ribs 4 is 20 or more, or further 15 or more. If the difference between them in thermal expansion coefficient is more than 20, the base substrate 2 will be warped, and when it is bonded to the front panel, cracking is liable to occur. If the mixed amount of silicon oxide is 60 wt % or less, the softening point becomes low and baking to the glass substrate can be performed advantageously.

If the mixed amount of boron oxide is in a range from 5 to 50 wt %, electric, mechanical and thermal properties such as electric insulation, strength, thermal expansion coefficient, and insulation layer compactness can be improved. If it is 50 wt % or less, glass stability can be kept.

Further, if at least one of bismuth oxide, lead oxide and zinc oxide is contained by 5 to 50 wt % in total, a glass paste with a temperature property suitable for patterning on the glass substrate can be obtained. If fine glass particles containing 5 to 50 wt % of bismuth oxide are used, such advantages that the pot life of the paste can be extended can be obtained. As bismuth-based fine glass particles, it is preferred to use a glass powder containing the following composition.

Bismuth oxide: 10 to 40 parts by weight
Silicon oxide: 3 to 50 parts by weight
Boron oxide: 10 to 40 parts by weight Barium oxide: 8 to 20 parts by weight
Aluminum oxide: 10 to 30 parts by weight Moreover, fine glass particles containing 3 to 20 wt % of at least one of lithium oxide, sodium oxide and potassium oxide can also be used. If the added amount of an alkali metal oxide is kept at 20 wt % or less, preferably 15 wt % or less, the stability of the paste can be improved. Among the aforesaid three alkali metal oxides, lithium oxide is especially preferred in view of the stability of the paste. As lithium-based fine glass particles, it is preferred to use, for example, a glass powder containing the following composition.

As the particular fine glass particles in this case, it is preferred to use a glass powder containing the following composition.

Lithium oxide: 2 to 15 parts by weight
Silicon oxide: 15 to 50 parts by weight
Boron oxide: 15 to 40 parts by weight
Barium oxide: 2 to 15 parts by weight
Aluminum oxide: 6 to 25 parts by weight Furthermore, if fine glass particles containing both a metal oxide such as lead oxide, bismuth oxide or zinc oxide and an alkali metal oxide such as lithium oxide, sodium oxide or potassium oxide are used, the softening temperature and the linear expansion coefficient can be easily controlled at lower alkali content.

Moreover, if the fine glass particles contain aluminum oxide, barium oxide, calcium oxide, magnesium oxide, titanium oxide, zinc oxide, zirconium oxide, etc., especially aluminum oxide, barium oxide and zinc oxide, processability can be enhanced, but in view of softening point and thermal expansion coefficient, it is preferred that the content of them is 40 wt % or less. More preferred is 25 wt % or less.

As the photosensitive organic ingredient, it is preferred to contain at least one photosensitive ingredient selected from photosensitive monomers, photosensitive oligomers and photosensitive polymers. Further, as required, a photopolymerization initiator, light absorber, sensitizer, organic solvent, sensitization aid and polymerization inhibitor are added.

The photosensitive monomer is a compound containing an unsaturated carbon-carbon bond. Particular examples of it are monofunctional and polyfunctional (meth)acrylates, vinyl compounds, allyl compounds, etc. One or more of them can be used.

The photosensitive oligomer or photosensitive polymer is an oligomer or polymer obtained by polymerizing at least one of the compounds having a carbon-carbon double bond. In the polymerization, the compound with a carbon-carbon double bond can be copolymerized with another photosensitive monomer, if the content of the compound with a carbon-carbon double bond is 10 wt % or more, preferably 35 wt % or more. If an unsaturated acid such as an unsaturated carboxylic acid is copolymerized with the polymer or oligomer, the development property after sensitizing can be improved. Particular examples of the unsaturated carboxylic acid include acrylic acid, methacrylic acid, itaconic acid, crotonic acid, maleic acid, fumaric acid, vinylacetic acid, their acid anhydrides, etc. It is preferred that the acid value (AV) of the polymer or oligomer with acid groups such as carboxyl groups at the side chains obtained like this is in a range from 50 to 180. A more preferred range is 70 to 140. If photoreactive groups are added to the side chains or molecular ends of any of the polymers and oligomers mentioned above, the product can be used as a photosensitive polymer or photosensitive oligomer. Preferred photoreactive groups are ethylenic unsaturated groups. As the ethylenic unsaturated groups, enumerated are vinyl groups, allyl groups, acrylic groups, methacrylic groups, etc.

Particular examples of the photopolymerization initiator include benzophenone, methyl O-benzoylbenzoate, 4,4-bis (dimethylamino)benzophenone, 4,4-bis(diethylamino)benzophenone, 4,4-dichlorobenzophenone, 4-benzoyl-4-methylphenylketone, dibenzyl ketone, fluorenone, 2,3-diethyoxyacetophenone, 2,2-dimethoxy-2-phenyl-2-phenylacetophenone, etc. One or more of them can be used. It is preferred that the added amount of the photopolymerization initiator is in a range from 0.05 to 10 wt % based on the weight of the photosensitive ingredient. A more preferred range is 0.1 to 5 wt %. If the amount of the polymeric initiator is too small, there arises a tendency toward lower photosensitivity, and if it is too large, there arises a tendency that the remaining rate of the exposed area becomes too small.

It is also effective to add a light absorber. If a compound with a high effect of absorbing ultraviolet light or visible light is added, a high aspect ratio, high precision and high resolution can be obtained. As the light absorber, an organic dye can be preferably used. Particularly azo dyes, aminoketone dyes, xanthene dyes, quinoline dyes, anthraquinone dyes, benzophenone dyes, diphenylcyanoacrylate dyes, triazine dyes, p-aminobenzoic acid dyes, etc. can be used. An organic dye is preferred for the reason that since it does not remain in the insulation film after firing, the decline of insulation film property by the light absorber can be reduced. Among these dyes, azo dyes and benzophenone dyes are preferred. It is preferred that the added amount of the organic dye is 0.05 to 5 wt %. A more preferred range is 0.05 to 1 wt %. If the added amount is too small, the effect of adding the light absorber tends to decrease, and if it is too large, the insulation film property after firing tends to decline.

The sensitizer is added for enhancing the sensitivity. Particular examples of the sensitizer include, 2,4-diethylthioxanthone, isopropylthioxanthone, 2,3-bis(4-diethylaminobenzal)cyclopentanone, 2,6-bis(4-dimethylaminobenzal) cyclohexanone, etc. One or more of them can be used. In the case where the sensitizer is added to the photosensitive paste, the added amount of it is usually 0.05 to 10 wt % based on the weight of the photosensitive ingredient. A more preferred range is 0.1 to 10 wt %. If the amount of the sensitizer is too small, there arises a tendency that the effect of improving photosensitivity cannot be exhibited, and if it is too large, there arises a tendency that the remaining rate of the exposed area becomes small.

Examples of the organic solvent include methyl cellosolve, ethyl cellosolve, butyl cellosolve, propylene glycol monomethyl ether acetate, methyl ethyl ketone, dioxane, acetone, cyclohexanone, cyclopentanone, isobutyl alcohol, isopropyl alcohol, tetrahydrofuran, dimethyl sulfoxide, γ-butyllactone, N-methylpyrrolidone, N,N-dimethylformamide, N,N-dimethylacetamide, bromobenzene, chlorobenzene, dibromobenzene, dichlorobenzene, bromobenzoic acid, chlorobenzoic acid, and an organic solvent mixture containing one or more of the foregoing.

Mixing the inorganic fine particles and the organic ingredient and dispersing homogeneously by a three-roll mill or kneading machine usually produces the photosensitive paste. The organic ingredient is selected from those enumerated above to achieve a predetermined composition. Then, the photosensitive paste is applied, dried, exposed, developed and fired.

In a series of these forming steps, the photosensitive paste can be applied by screen printing, or using a bar coater, roll coater, die coater or blade coater, etc. The coating thickness can be adjusted by selecting the coating frequency, mesh size of a screen and paste viscosity.

In this case, it is preferred that the photosensitive coating width (L) is in the following relation with the length L (mm) of the barrier rib pattern of the barrier rib layer to be obtained.

$$L-2 \text{ (mm)} \leq L \text{ (mm)} \leq L+5 \text{ (mm)}$$

If the length is in the above range, the exposure method of this invention described later can be effectively performed. Meanwhile, the length of the pattern refers to the length of the linear pattern continuous in one direction.

Further, it is preferred that the ends of the barrier rib pattern corresponding to the terminal ends 4-2 of the coating width are formed to be gradually lower in height (tapered). It is preferred that the length of the ranges in which the height becomes gradually lower is 0.5 to 6 mm. A more preferred range is 1 to 4 mm. If the ends of the barrier rib pattern are formed like this, the up-springing of the ends by the firing shrinkage of the barrier rib layer can be prevented. Further, the drying after completion of said coating can be performed using a forced air oven, hot plate or IR furnace, etc.

Then, the dried coating film is exposed through a photo mask 1 having a desired pattern.

In the case where the barrier rib pattern to be obtained consists of stripes as shown in FIG. 2 or 3, after the base substrate 2 and the photo mask 1 are adjusted in position, an exposure operation for irradiating an energy beam through a photo mask 1 is performed. In this invention, the base substrate 2 or the photo mask 1 is moved while an exposure operation is performed. In this case, the direction in which the base substrate 2 or the photo mask 1 is moved must be the extension direction of the striped pattern formed in the photo mask 1. By doing so, the variation in the amount of exposure through the pattern can be reduced. Further, it is preferred that the moving distance of the base substrate 2 or the photo mask 1 during the exposure operation is 0.03 to 10 mm. A more preferred range is 0.05 to 7 mm, and a further more preferred range is 0.10 to 5 mm. If the moving distance is less than 0.03 mm, the effect of reducing the occurrences of pattern defects of barrier rib 3 caused by the foreign matters deposited on the photo mask 1 and the flaws, etc. formed in the photo mask 1 is low. If it is more than said range, the exposure operation time becomes long to elongate the tact time, thus lowering the productivity.

Further, it is preferred that the length of the pattern formed in the photo mask 1 used in this case is longer than said coating width. Particularly it is preferred that the length is longer than the coating width L of the photosensitive paste by 1 to 20 mm, further by 1 to 10 mm. It is not preferred that the length is longer by less than the range, since the movement of the base substrate 2 or the photo mask 1 during the exposure operation causes exposure shortage at the regions corresponding to the terminal ends 4-2 of the barrier rib pattern, and the pattern is likely to be thinner or to peel. It is not preferred either that the length is longer by more than the range, since the leak of the energy beam may cure unnecessary portions.

Furthermore, for the purpose of reducing the exposure shortage at the terminal ends 4-2 of the pattern, it is preferred that the thickness of the coating film of the photosensitive paste is formed to be smaller toward the terminal ends 4-2 in the longitudinal direction of the barrier rib pattern (tapered at the ends). In this invention, in the case where the terminal ends 4-2 are tapered, it is preferred that the length of the tapered ends is 1 to 10 mm, further 1.2 to 8 mm at the terminal ends 4-2 of the coating film. It is not preferred that the length of the tapered portions is less than the said range, since the effect of reducing the exposure shortage is low, or that the length is more than said range, since the pattern length of the standard portions becomes short.

Moreover, for reducing the exposure shortage at such ends, a method of thickening the width of or rounding the stripes arranged in the photo mask 1 only in the portions corresponding to the terminal ends 4-2 of the pattern in the longitudinal direction of barrier ribs 3 can also be preferably applied in this invention. For example, in the case where the stripes at the terminal ends 4-2 of the pattern in the longitudinal direction of barrier ribs 3 are thickened, though depending on the distance of relative movement between the photo mask 1 and the base substrate 2, it is preferred that the width of the stripes in the portions corresponding to usually 1.2 to 3 times the distance of relative movement at the terminal ends 4-2 in the longitudinal direction of the pattern is thickened to 1.1 to 5 times the width of the standard pattern portions 4-1 (central portions). Meanwhile, the terminal ends 4-2 in this case refer to the start points and end points of the continuous straight stripes of the pattern, and the standard pattern portions 4-1 refer to the area where actually an image is displayed as a PDP.

Further, in the case where the barrier rib pattern to be obtained is a pattern of periodic lattices consisting of barrier ribs 3 and auxiliary barrier ribs 4 as shown in FIG. 4, in this invention, the photosensitive paste is applied, and the auxiliary barrier ribs 4 (lateral stripes) are once exposed by the aforesaid method, then the barrier ribs 3 (longitudinal stripes) being exposed by the aforesaid method.

In the case where it is desired to form a level difference between the barrier ribs 3 and the auxiliary barrier ribs 4, either the auxiliary barrier ribs 4 or the barrier ribs 3, whichever are lower, are exposed by the aforesaid method, and the photosensitive paste is applied by an amount corresponding to the level difference between the barrier ribs 3 and the auxiliary barrier ribs 4, and dried. Then, the barrier ribs 3 or the auxiliary barrier ribs 4, whichever are higher, are exposed by said method, to form a pattern of periodic lattices s different in level between the barrier ribs 3 and the auxiliary barrier ribs 4.

Further, for the purpose of reducing the exposure shortage at the terminal ends 4-2 of the auxiliary barrier ribs 4 (lateral stripes), a method of thickening the width of the barrier ribs 3 (longitudinal stripes) in the portions corresponding to the terminal ends 4-2 of the auxiliary barrier ribs 4 as shown in FIG. 5, or a method of disposing plural barrier ribs 3 as shown in FIG. 6, or a method of thickening the width of the terminal ends 4-2 of the auxiliary barrier ribs 4 as shown in FIG. 7 can be preferably applied in this invention. The width of the barrier ribs 3 or the width of the areas where plural barrier ribs 3 are formed depends on said moving distance of the base substrate 2 or the photo mask 1 during the operation to expose the auxiliary barrier ribs 4, but it is preferred that the width is 1.2 times or more of the moving distance of the base substrate 2 or the photo mask 1. A more preferred ratio is 1.5 times or more. By doing so, the exposure shortage at the ends of the auxiliary barrier ribs 4 can be compensated by the exposure of the barrier ribs 3 performed later. Further in the case where the terminal ends 4-2 of the auxiliary barrier ribs 4 are thickened in width as shown in FIG. 7, it is preferred that the length of the auxiliary barrier ribs 4 on the photo mask 1 is shorter than the length of the actually obtained auxiliary barrier ribs 4, and that the length shortage is equal to the moving distance. Further, the length of the thickened terminal ends 4-2 depends on the moving distance, but it is preferred that the length is 1 time or more. A more preferred ratio is 1.1 times or more. By doing so, the exposure shortage at the ends of the auxiliary barrier ribs 4 can be compensated by the exposure of the barrier ribs 3 performed later.

It is preferred that the width of the terminal ends 4-2 in the longitudinal direction of the pattern is 1.2 to 3 times the width of the standard pattern portions 4-1. If the width is less than said range, exposure shortage is likely to occur at the terminal ends 4-2 of the pattern, and if the width is more than said range, there arises a tendency that a residue or pattern failure is likely to occur at the time of development.

Examples of the energy beam used for the exposure operation of this invention include a visible light beam, near ultraviolet light beam, ultraviolet light beam, electron beam, X-ray beam, laser beam, etc. Among them, an ultraviolet light beam is most preferred, and as its light source, for example, a low-pressure mercury lamp, high-pressure mercury lamp, super high-pressure mercury lamp, halogen lamp, germicidal lamp, etc. can be used. Among them, an ultrahigh pressure mercury lamp is suitable. The exposure conditions depend on the coating thickness, but a super high-pressure mercury lamp with an output of 1 to 100 mW/cm$^2$ can be used for performing exposure for 0.1 to 10 minutes.

In this case, it is preferred to adjust the distance, i.e., the gap between the photo mask 1 and the surface of coating film of the photosensitive paste at 50 to 500 μm. A more preferred gap is 70 to 400 μm. If the gap is 50 μm or more, further 70 μm or more, the contact between the coating film of photosensitive paste and the photo mask 1 can be prevented or it can be prevented that they are broken or contaminated, when the base substrate 2 or the photo mask 1 is moved. Further, if the gap is 500 μm or less, further 400 μm or less, adequately sharp patterning is possible.

After completion of exposure, using the difference between the exposed area and the non-exposed area in developer solubility performs development. The development can be performed by immersion, spraying, brushing, etc.

The developer used is a solution that can dissolve the desired organic ingredient of the photosensitive paste. In the case where a compound with an acid group such as a carboxyl group exists in the photosensitive paste, an alkali aqueous solution can be used for development. The alkali aqueous solution can be aqueous solution of sodium hydroxide, aqueous solution of sodium carbonate or aqueous solution of calcium hydroxide, etc. However, it is preferred to use an aqueous solution of organic alkali, since the alkali component can be easily removed at the time of firing. As the organic alkali, a general amine compound can be used. Examples of it include tetramethylammonium hydroxide, trimethylbenzylammonium hydroxide, monoethanolamine, diethanolamine, etc. The concentration of the alkali aqueous solution is usually 0.01 to 10 wt %. A more preferred range is 0.1 to 5 wt %. If the alkali concentration is too low, there arises a tendency that the soluble area cannot be removed, and if the alkali concentration is too high, there arises a tendency that the pattern portions peel or that the non-soluble area is corroded. Further, it is preferred in view of process control that the development is performed at a development temperature of 20 to 50° C.

Then, the pattern of barrier ribs 3 and auxiliary barrier ribs 4 obtained by development is fired in a firing furnace. The firing atmosphere and temperature depend on the paste and the base substrate 2 used. Firing is performed in an atmosphere of air, nitrogen, hydrogen, etc. As the firing furnace, a batch-type firing furnace or a continuous roller hearth furnace can be used. The desirable firing temperature is 400 to 800° C.

In the case where the barrier ribs 3 are formed directly on a glass substrate, they can be kept at a temperature of 450 to 620° C. for 10 to 60 minutes, for being fired.

In the case where the width of the barrier ribs 3 is extremely different from the width of the auxiliary barrier ribs, particularly in the case where the width of the auxiliary barrier ribs 4 is extremely larger than the width of the barrier ribs, when they are fired, it can happen that the barrier ribs 3 are disconnected or the auxiliary barrier ribs 4 are cracked at the interfaces between the barrier ribs 3 and the auxiliary barrier ribs 4 due to the difference between the barrier ribs 3 and the auxiliary barrier ribs 4 in firing shrinkage behavior.

To solve this problem, if striped grooves are formed at the crests of the auxiliary barrier ribs, the firing shrinkage of the auxiliary barrier ribs 4 can be eased, and the disconnections of the barrier ribs 3 at the interfaces between the auxiliary barrier ribs 4 and the barrier ribs 3 can be reduced.

Then, between the barrier ribs 3 formed in the direction parallel to the predetermined address electrodes, a phosphor layer emitting respective light colors of R (red), G (green) and B (blue) is formed. The phosphor layer can be formed by applying phosphor pastes respectively mainly composed of a phosphor powder, an organic binder and an organic solvent between predetermined barrier ribs, drying and as required, firing.

The method for applying the phosphor pastes of the respective colors to predetermined places between barrier ribs 3 can be a screen printing method for printing a pattern using a screen printing plate, a dispenser method for discharging the phosphor pastes as a pattern from the tips of discharge nozzles, or photolithography using said photosensitive organic ingredient as the organic binder of each phosphor paste. In view of cost, the screen printing method and the dispenser method can be preferably used in this invention.

In the case where the phosphors are formed using the photolithography, this invention can be preferably applied.

As the exposure method, the same method used for said barrier rib pattern can be used.

EXAMPLES

This invention is described below particularly in reference to examples, but is not limited thereto or thereby. In the following examples and comparative examples, each concentration (%) is wt %.

Example 1

On a glass substrate PD200 (size: 964×570 mm), address electrodes were prepared using a photosensitive silver paste. The photosensitive silver paste was applied, dried, exposed, developed and fired to form address electrodes with a line width of 100 μm and a thickness of 3 μm at a pitch of 300 μm.

Then, 60 wt % of a glass powder with a low melting point containing 75 wt % of bismuth oxide was kneaded with 10 wt % of a titanium oxide powder with an average particle size of 0.3 μm, 15 wt % of ethyl cellulose and 15 wt % of terpineol, to obtain a glass paste, and it was applied by screen printing to form a thickness of 20 μm covering the bus electrodes in the display area, and fired at 570° C. for 15 minutes, to form a dielectric layer.

On the dielectric layer, a photosensitive paste was applied. The photosensitive paste consisted of a glass powder and an organic ingredient containing a photosensitive ingredient. The glass powder was glass particles with an average particle size of 2 μm obtained by grinding a glass composed of 10 wt % of lithium oxide, 25 wt % of silicon oxide, 30 wt % of boron oxide, 15 wt % of zinc oxide, 5 wt % of aluminum oxide and 15 wt % of calcium oxide. The organic ingredient containing a photosensitive ingredient consisted of 30 wt % of an acrylic polymer containing carboxyl groups, 30 wt % of trimethylolpropane triacrylate, 10 wt % of Irgacure 369' (produced by Ciba Geigy) as a photopolymerization initiator and 30 wt % of γ-butyrolactone.

The photosensitive paste was prepared by mixing the glass powder and the organic ingredient containing a photosensitive ingredient at a ratio by weight of 70:30 and kneading by a roll mill.

Then, the photosensitive paste was applied using a die coater to have a coating width of 530 mm and a thickness after drying of 200 μm. For drying, Clean Oven (produced by Yamato Scientific Co., Ltd.) was used. After completion of drying, a photo mask 1 having a pattern of stripes with a width of 50 μm and a length of 536 mm formed at a pitch of 300 μm was arranged for exposure. An exposure operation was performed at an exposure illumination intensity of 20 mW/cm$^2$ for an exposure time of 20 seconds with the distance (gap) between the photo mask 1 and the coating film on the base substrate 2 kept at 200 μm, with the substrate and the photo mask 1 aligned to each other, while the base substrate 2 was moved at 0.025 mm/second for a distance of 0.5 mm in the extension direction of the stripe pattern. Meanwhile, when the exposure was performed, black foreign matters with a size of 100 μm were scattered on the photo mask 1.

After completion of exposure, development was performed in 0.5 wt % ethanolamine aqueous solutions, and firing was performed at 580° C. for 15 minutes, to obtain a barrier rib pattern.

The obtained barrier rib pattern was inspected using an image inspection apparatus (Super Neptune 9000 produced by V Technology), to check whether or not defects occurred. As a result of the inspection, the obtained barrier rib pattern was found to be free from any defect such as disconnection, chipping, thickening, or short-circuit.

Comparative Example 1

A barrier rib pattern was obtained according to the same method as described for Example 1, except that the base substrate 2 was not moved during the exposure operation (both the base substrate 2 and the photo mask 1 were kept stationary), and image inspection was performed. As a result of the inspection, the obtained barrier rib pattern had numerous disconnections and chippings occurring at the portions of black foreign matters deposited on the photo mask 1.

Example 2

A barrier rib pattern was obtained according to the same method as described for Example 1, except that for exposure, the base substrate 2 and the photo mask 1 were aligned to each other, that an exposure operation was performed once for 10 seconds, that the base substrate 2 was moved in the extension direction of the stripe pattern disposed on the photo mask 1 by 0.5 mm, and that another exposure operation was performed for 10 seconds.

The obtained barrier rib pattern was inspected using an image inspection apparatus, to check whether or not defects occurred. As a result of the inspection, the obtained barrier rib pattern was found to be free from any defect such as disconnection, chipping, thickening or short-circuit, though the portions corresponding to the black foreign matters on the photo mask 1 tended to be somewhat thin.

Example 3

Address electrodes were prepared on a glass substrate PD200 (size: 964×570 mm) using a photosensitive silver paste. The photosensitive silver paste was applied, dried, exposed, developed and fired, to form address electrodes with a line width of 100 μm and a thickness of 3 μm at a pitch of 300 μm.

Then, 60% of a glass powder with a low melting point containing 75 wt % of bismuth oxide was kneaded with 10 wt % of titanium oxide powder with an average particle size of 0.3 μm, 15% of ethyl cellulose and 15% of terpineol, to obtain a glass paste, and it was applied by screen printing to form a thickness of 20 μm covering the bus electrodes in the display area and fired at 570° C. for 15 minutes, to form a dielectric layer.

On the dielectric layer, a photosensitive paste was applied. The photosensitive paste consisted of a glass powder and an organic ingredient containing a photosensitive ingredient. The glass powder used was glass particles with an average particle size of 2 μm obtained by grinding a glass composed of 10 wt % of lithium oxide, 25 wt % of silicon oxide, 30 wt % of boron oxide, 15 wt % of zinc oxide, wt % of aluminum oxide and 15 wt % of calcium oxide. The organic ingredient containing a photosensitive ingredient used consisted of 30 wt % of an acrylic polymer containing carboxyl groups, 30 wt % of trimethylolpropane triacrylate, 10 wt % of "Irgacure 369" (produced by Ciba Geigy) as a photopolymerization initiator and wt % of γ-butyrolactone.

The photosensitive paste was prepared by mixing the glass powder and the organic ingredient containing a photosensitive ingredient at a ratio by weight of 70:30, and kneading by a roll mill.

Then, the photosensitive paste was applied using a die coater to have a coating width of 530 mm and a thickness after drying of 170 μm. For drying, Clean Oven (produced by Yamato Scientific Co., Ltd.) was used.

After completion of drying, a photo mask 1 having a pattern of stripes with a width of 50 μm and a length of 930.6 mm formed at a pitch of 700 μm (for auxiliary barrier ribs) was arranged for exposure. An exposure operation was performed at an exposure illumination intensity of 20 mW/cm$^2$ for an exposure time of 20 seconds with the distance (gap) between the photo mask 1 and the coating film on the base substrate 2 kept at 200 μm, with the base substrate 2 and the photo mask 1 aligned to each other, while the base substrate 2 was moved at 0.025 mm/second for a distance of 0.3 mm in the extension direction of the stripe pattern. Meanwhile, when the exposure was performed, black foreign matters with a size of 100 μm were scattered on the photo mask 1.

On it, the photosensitive paste was applied using a die coater, to have a coating width of 525 mm and a thickness after drying of 40 μm. For drying, Clean Oven (produced by Yamato Scientific Co., Ltd.) was used.

After completion of drying, a photo mask 1 with a pattern of stripes with a width of 50 μm and a length of 536 mm formed at a pitch of 300 mm, except that the width of the rightward most line and the leftward most line was 400 μm (for barrier ribs), was arranged for exposure. An exposure operation was performed at an exposure illumination intensity of 20 mW/cm$^2$ for an exposure time of 20 seconds with the distance (gap) between the photo mask 1 and the coating film on the base substrate 2 kept at 200 μm, with the base substrate 2 and the photo mask 1 aligned to each other, while the base substrate 2 was moved at 0.025 mm/second for a distance of 0.5 mm in the extension direction of the stripe pattern. Meanwhile, while the exposure was performed, black foreign matters with a size of 100 μm were scattered on the photo mask 1.

After completion of exposure, development was performed in 0.5 wt % ethanolamine aqueous solutions, and further firing was performed at 580° C. for 15 minutes, to obtain a barrier rib pattern of periodic lattices having a level difference between the barrier ribs 3 and the auxiliary barrier ribs. The obtained barrier rib pattern was inspected using an image inspection apparatus (Super Neptune 9000 produced by V Technology), to check whether or not defects occurred. As a result of the inspection, the obtained barrier rib pattern was found to be free from any defect such as disconnection, chipping, thickening, short-circuit, etc.

Comparative Example 2

A barrier rib pattern of periodic lattices was obtained according to the same method as described for Example 3, except that the base substrate 2 was not moved during the exposure operation of the barrier ribs and the auxiliary barrier ribs (both the base substrate 2 and the photo mask 1 were kept stationary), and image inspection was performed. As a result of the inspection, the obtained pattern of the auxiliary barrier ribs and the barrier ribs was found to have numerous disconnections and chippings occurring in the portions of black foreign matters deposited on the photo mask 1.

Example 4

A barrier rib pattern was obtained according to the same method as described for Example 1, except that the photo mask 1 used for exposing the coating film of the photosensitive paste (50 μM in the width of the terminal ends 4-2 and in the width of the standard pattern portions 4-1) had a stripe pattern length of 530 mm and a width of 80 μm in the ranges of 0.8 mm inside at the terminal ends 4-2 in the longitudinal direction of the stripe pattern (the width of terminal ends 4-2). That is, the width of the terminal ends 4-2 of this photo mask 1 was 1.6 times the width of the standard pattern portions 4-1. The obtained barrier rib pattern was inspected using an image inspection apparatus, to check whether or not defects occurred. As a result of the inspection, the obtained barrier rib pattern was found to be free from any defect such as disconnection, chipping, thickening, short-circuit, etc.

The invention claimed is:

1. A method of manufacturing a display member having a pattern of stripes on a base substrate, the method comprising:
performing an exposure operation by exposing a photosensitive layer formed on the base substrate through a photo mask having a pattern of stripes; and
developing the exposed photosensitive layer to form the pattern of stripes, wherein the photo mask and the base substrate are moved relative to each other along a direction parallel to the direction of the stripes during the exposure operation, and
a length of the pattern of the photo mask is longer than a coating width of the photosensitive layer.

2. The method of manufacturing the display member according to claim 1, wherein during the exposure operation, a distance of relative movement between the photo mask and the base substrate is 0.03 to 10 mm.

3. A method of manufacturing a display member having a pattern of stripes on a base substrate, the method comprising:
performing plural exposure operations by exposing a photosensitive layer formed on the base substrate through a photo mask having a pattern of stripes; and
developing the exposed photosensitive layer to form the pattern of stripes, wherein the photo mask and the base substrate are moved relative to each other along a direction parallel to the direction of the stripes in the duration between at least two exposure operations, and
a distance of relative movement between the photo mask and the base substrate is 0.03 to 0.5 mm.

4. A method of manufacturing a display member having a pattern of periodic lattices on a base substrate, the method comprising:
performing an exposure operation for forming auxiliary barrier ribs by exposing a photosensitive layer formed on the base substrate through a photo mask having a pattern of stripes for the auxiliary barrier ribs;
developing the exposed photosensitive layer to form the stripes of the auxiliary barrier ribs;
performing an exposure operation for forming barrier ribs by exposing a photosensitive layer formed on the base substrate with the pattern of stripes of the auxiliary barrier ribs formed thereon through a photo mask having a pattern of stripes for the barrier ribs which are directed laterally to the pattern of stripes of the auxiliary barrier ribs; and
developing the exposed photosensitive layer to form the pattern of stripes of the barrier ribs, thereby obtaining the pattern of periodic lattices,
wherein in the exposure operation for forming the auxiliary barrier ribs, the photo mask and the base substrate are moved relative to each other along a direction parallel to the direction of the pattern of stripes for the auxiliary barrier ribs during the exposure operation, and
a length of the pattern of the photo mask is longer than a coating width of the photosensitive layer,
wherein in the exposure operation for forming the barrier ribs, the photo mask and the base substrate are moved relative to each other along a direction parallel to the direction of the pattern of stripes for the barrier ribs during the exposure operation, and
a length of the pattern of the photo mask is longer than a coating width of the photosensitive layer.

5. The method of manufacturing the display member according to claim 4, wherein during the exposure operation, a distance of relative movement between the first photo mask and the base substrate is 0.03 to 10 mm.

6. A method of manufacturing a display member having a pattern of periodic lattices on a base substrate, the method comprising:
performing plural exposure operations for forming auxiliary barrier ribs by exposing a photosensitive layer formed on the base substrate through a photo mask having a pattern of stripes for the auxiliary barrier ribs;
developing the exposed photosensitive layer to form the stripes of the auxiliary barrier ribs;
performing plural exposure operations for forming barrier ribs by exposing a photosensitive layer formed on the base substrate with the pattern of stripes of the auxiliary barrier ribs formed thereon through a photo mask having a pattern of stripes for the barrier ribs which are directed laterally to the pattern of stripes of the auxiliary barrier ribs; and
developing the exposed photosensitive layer to form the pattern of stripes of the barrier ribs, thereby obtaining the pattern of periodic lattices, wherein in each of the exposure operations,
the photo mask and the base substrate are moved relatively to each other along a direction parallel to the direction of the stripes in the duration between at least two exposure operations, and
a distance of relative movement between the photo mask and the base substrate is 0.03 to 0.5 mm.

* * * * *